(12) United States Patent
Burgei, Jr.

(10) Patent No.: US 6,198,270 B1
(45) Date of Patent: Mar. 6, 2001

(54) ELECTRONIC WIRE SORTER

(76) Inventor: James William Burgei, Jr., P.O. Box 1033, Mio, MI (US) 48647

( * ) Notice: Subject to any disclaimer, the term of this patent is extended or adjusted under 35 U.S.C. 154(b) by 0 days.

(21) Appl. No.: 09/287,886

(22) Filed: Apr. 9, 1999

(51) Int. Cl.[7] ............................ G01R 19/00; H01H 31/02
(52) U.S. Cl. ........................................... 324/66; 324/539
(58) Field of Search ..................... 324/66, 539, 540, 324/542, 555, 556

(56) References Cited

U.S. PATENT DOCUMENTS

| | | | | |
|---|---|---|---|---|
| 4,524,320 | * | 6/1985 | Brooks .................................. | 324/66 |
| 4,736,158 | * | 4/1988 | McCartney ........................... | 324/66 |
| 4,974,311 | * | 12/1990 | Tran ..................................... | 29/721 |
| 5,052,104 | * | 10/1991 | Tran ..................................... | 29/721 |
| 5,414,343 | * | 5/1995 | Flaherty et al. ...................... | 324/66 |
| 5,627,474 | * | 5/1997 | Baudisch .............................. | 324/66 |

* cited by examiner

*Primary Examiner*—Safet Metjahic
*Assistant Examiner*—Jermele Hollington
(74) *Attorney, Agent, or Firm*—Reising, Ethington, Barnes, Kisselle, Learman & McCulloch, P.C.

(57) ABSTRACT

A device comprising of multiple quick connect/disconnect terminals used in conjunction with light emitting diodes connected to an integrated circuit using a single test probe, providing an efficient means when having to sort multiple conductors. The L.E.D's used in this device remain energized even after the test probe has been removed. This provides a useful alternative when having to sort multiple conductors within a particular wire bundle which may travel to a remote enclosure located away from it's origination point. Also this device is contained within a compact enclosure and operates from a small 9VDC power source, providing both convienence and safety to the panel assembler using this device.

2 Claims, 3 Drawing Sheets

ELECTRONIC WIRE SORTER

FIELD OF THE INVENTION

The present invention relates to a device which assists in the wiring of de-energized machine electrical panels both safely and efficiently.

PRIOR ART

To the best of my knowledge relating to panel assembly and wiring techniques, the task of sorting wires in a de-energized electrical enclosure is achieved using a DMM (Digital Multimeter). Even though this technique is successful in locating both ends of a particular wire, it's extremely time consuming and often a very frustrating task. Using this previous method is what caused me to try and find a more efficient way when needing to trace multiple wires of the same color and within the same wire bundle, which is often the case when wiring a new enclosure for the first time. Referring to the previous technique for tracing multiple wires, is an Indicator to me that my invention would help to provide an easier and more efficient method for sorting wires.

SUMMARY OF THE INVENTION

This present invention allows a more efficient way to wire a machine when the main electrical enclosure contains an SLC processor with multiple I/O modules. Often each I/O module contains up to 16 or more discrete I/O(inputs or outputs) to which external devices may be connected. This present invention allows the panel assembler to route and bundle all wires coming from the I/O module down to the external terminal/fuse blocks where the other end will need to be connected. Once routed to the terminal blocks the user of this invention can place one wire into each of the 16 quick connect/disconnect terminals(F) of the wire sorter(FIG.2). The only task required now of the assembler is to use the common lead of the wire sorter to touch the corresponding I/O module terminals from which the wire bundle is routed (FIG.4). After touching one of the I/O terminals, the corresponding wire connected to the wire sorter will be illuminated by an L.E.D(Light Emitting Diode)located next to it. The L.E.D will than remain on until the assembler either resets the unit using the built in reset switch or until they touch another I/O terminal on the corresponding module. The wire sorter only allows one L.E.D to be illuminated at one particular time,thus eliminating the possible confusion of having multiple L.E.D's illuminated. This function is extremely useful when having to trace de-energized wires that are running through either flexible or rigid electrical conduit. This allows an electrician to be able to wire from one enclosure to another without the help of someone else. Offering an extremely useful option when dealing with a limited workforce. This invention could also have a built in timing circuit which would allow the unit to turn itself off if for some reason it was accidently left on.

DETAILED DESCRIPTION

Figure 1:
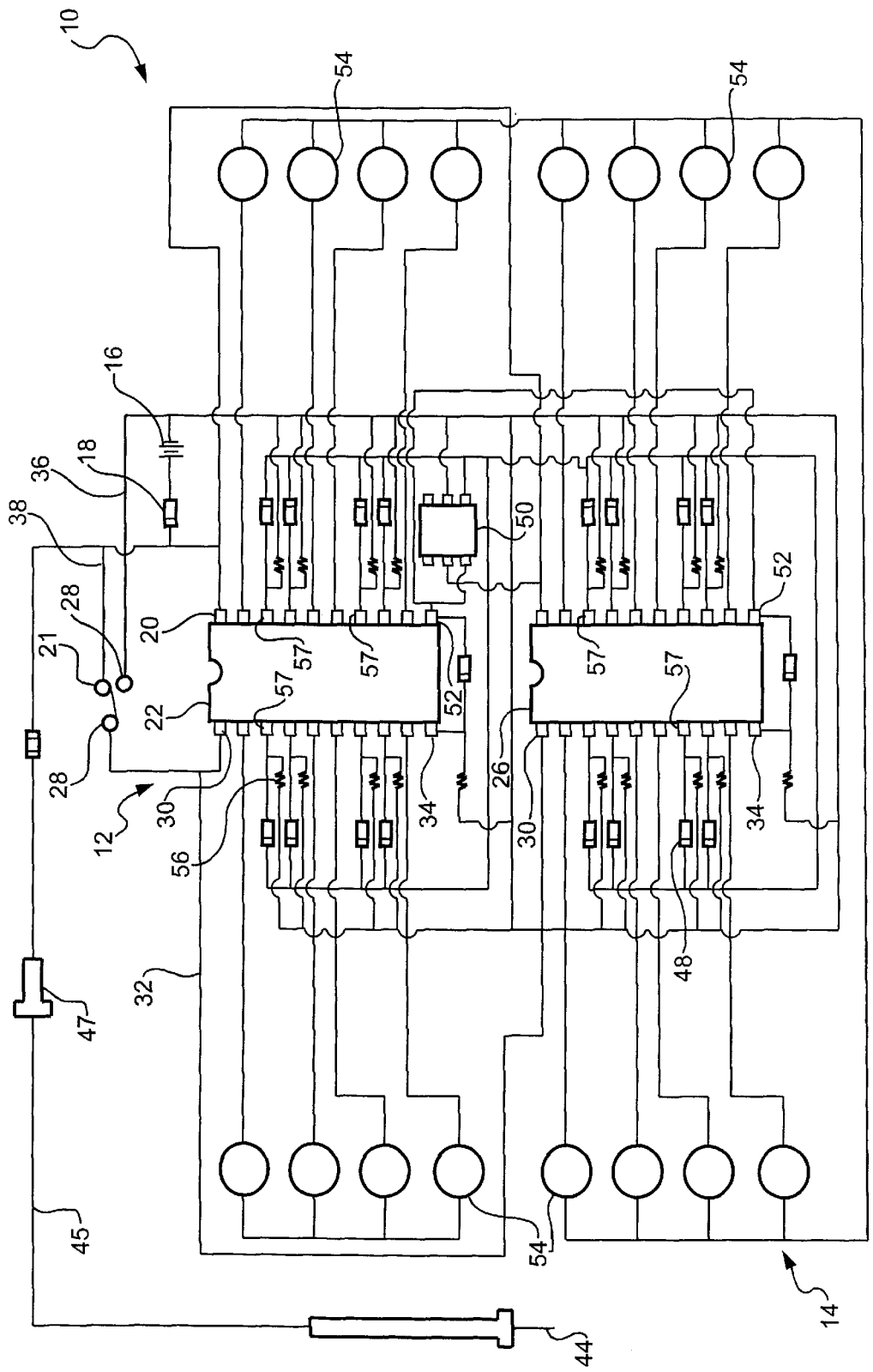
FIG. 1 is a circuit diagram for the wire sorter.
Figure 2:
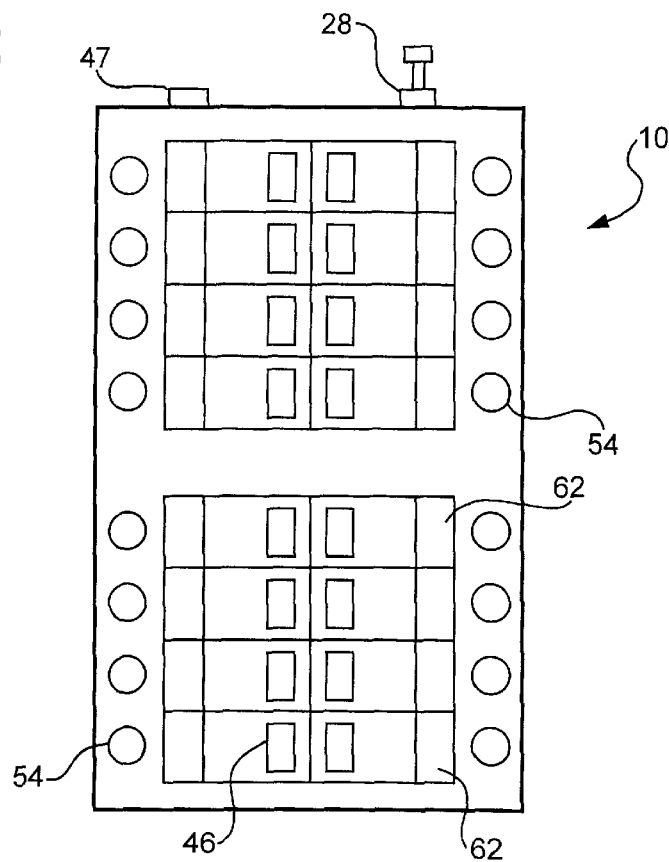
FIG. 2 is a plan view of the wire sorter.
Figure 3A:
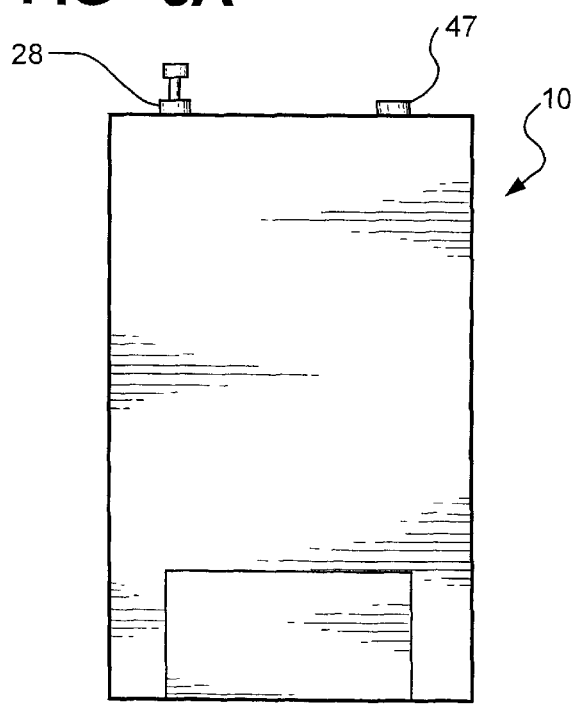
FIG. 3A is a bottom view of the wire sorter.
Figure 3B:
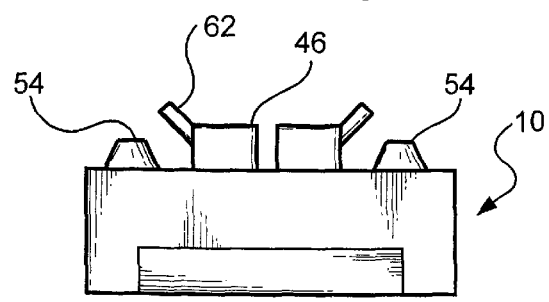
FIG. 3B is an end elevational view of the wire sorter.
Figure 4:
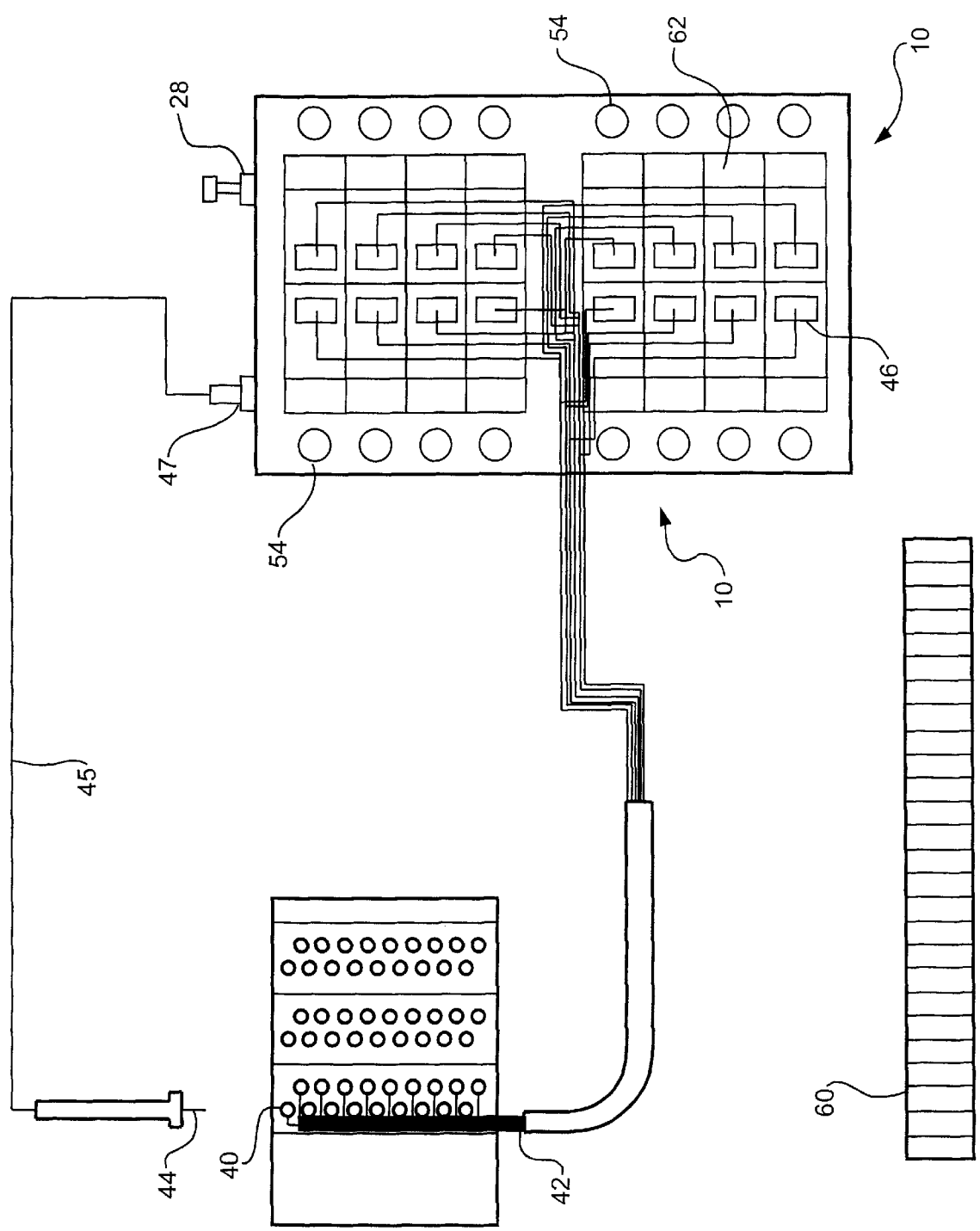
FIG. 4 is a diagrammatic view of the wire sorter in use.

Referring to FIG. 1, which is an overall schematic view, the wire sorter 10 consists of two Octal D-Type Flip-Flops (1A) and (2A) indicated by reference numbers 12 and 14 containing a built in reset and positive-edge triggering function. These devices are powered from a 9VDC power source 16, as shown in FIG. 1, running through a 5.1 vdc zener diode (B) indicated by reference number 18 causing an approximate 2VDC voltage drop across the diode. The reduced voltage is used to supply power to the (VCC) pin 20 on chip 22 and pin 20 on chip 26 and to the momentary SPDT reset switch 28 used to enable the logic chips when a positive voltage is applied to the (MR) pins 30. The reset switch 28 is wired in such a way that the common lead 32 of the switch connects to the (MR) pin 30 on both chips 22 and 26 with the normally open lead 36 of the switch connecting to the (GND) pin 34 of both chips and the normally closed lead 38 of the switch 28 connects to the 6–7VDC source 16. Both chips 22 and 26 are in an enabled state when they receive a positive voltage to the (MR) pins 30 from the normally closed contact 21 of the reset switch 28. After touching one of the I/O terminals 40 connected to the wires 42 which lead down to the wire sorter 10 with the removable test probe (D) 44 connected to a test probe connection 47 on the wire sorter 10 by a wire 45, a high voltage transition occurs on the corresponding input 46 that the wire 42 is connected too (approx. 6–7VDC). Each input 46 is connected to one of the eight inputs (D0–D7) indicated by reference number 57, on the chip 22 or one of the eight inputs (D0–D7) 57 on chip 26. This high transition is also branched through switching diodes 48 connected in parallel which are used to drive an opto-coupler (E) 50. The diodes 48 prevent the other inputs (D0–D7) 57 from receiving the same positive signal. Also actuation of the opto-coupler 50 causes a low to high transition on the (CP) pin 52 of both chips 22 and 26. This opto-coupler 50 is also used to help isolate the (CP) pins 52 of both chips 22 and 26 from the rest of the circuit when in an off state (0-VDC), thus preventing accidental tripping of the (CP) pin 52. After the low to high transition of the (CP) pins 52, the input which is in a high state causes its corresponding output (Q0–Q7) 59 to also go high. When in a high state the outputs (Q0–Q7) 59 of each chip 22 and 26 are coupled to one of the sixteen L.E.D's 54 available (1–16). The output that is in a high state remains in that high state until the (MR) pin 30 is caused to go low from the reset switch 28 or until the chip receives another low to high transition to the (CP) pin 52. Each input (D0–D7) 57 uses a resistor 56 which connects to the 0-VDC terminal 23 which enables the inputs to go to a low state (0-VDC) when not in an active state.

A lead 42 identified by an illuminated L.E.D 54 is removed from the adjacent input 46 and connected to the terminal block 60 that is associated with the I/O terminal 40 that was contacted by the test probe 44. The lead 42 is released from the input 46 by pressing a quick release button 62.

What is claimed is:

1. A method of wiring a machine employing a wire sorter including a plurality of sorter terminals, a light associated with each of the sorter terminals, and a touch probe comprising:

routing a bundle of de-energized wires from a machine I/O module to a plurality of machine terminal blocks;

connecting a first wire end of each wire of said bundle of de-energized wires to one of a plurality of first end machine terminals;

connecting a second wire end of each wire of said bundle of de-energized wires to one of the plurality of sorter terminals of the wire sorter;

contacting one of the plurality of first end machine terminals connected to a selected wire of said bundle of said de-energized wires with the touch probe of the wire sorter;

illuminating the light associated with the sorter terminal to which the second wire end of the selected wire is connected;

de-energizing all of the energized light associated with the plurality of sorter terminals other than the sorter terminal connected to the selected wire;

disconnecting the second wire end of the selected wire from the wire sorter; and connecting the second wire end of the selected wire to a second end machine terminal that corresponds to the first end machine terminal to which the first wire end of the selected wire is connected.

2. A method of wiring a machine employing a wire sorter as set forth in claim 1 wherein the light associated with each of the sorter terminals is a light emitting diode.

* * * * *